(12) United States Patent
Fisher

(10) Patent No.: US 6,577,137 B1
(45) Date of Patent: Jun. 10, 2003

(54) REVERSE INERTIAL LOAD TEST

(76) Inventor: James Allan Fisher, 511 Lewisham Ave., Kettering, OH (US) 45429

( * ) Notice: Subject to any disclaimer, the term of this patent is extended or adjusted under 35 U.S.C. 154(b) by 0 days.

(21) Appl. No.: 09/566,244

(22) Filed: May 5, 2000

(51) Int. Cl.$^7$ ............................................. G01R 31/00
(52) U.S. Cl. ...................................... 324/500; 324/772
(58) Field of Search ................................ 324/772, 500, 324/177, 545; 318/434, 280, 461, 432; 702/32–34, 183, 187

(56) References Cited

U.S. PATENT DOCUMENTS

| | | | | |
|---|---|---|---|---|
| 3,079,523 A | * | 2/1963 | Thieme | 324/177 |
| 3,854,077 A | * | 12/1974 | Greenwell | 318/808 |
| 3,942,114 A | * | 3/1976 | Keeling | 324/177 |
| 4,156,188 A | | 5/1979 | Kreissl | |
| 4,322,668 A | * | 3/1982 | Trussler et al. | 318/434 |
| 4,449,082 A | * | 5/1984 | Webster | 318/271 |
| 4,680,513 A | * | 7/1987 | Kennedy | 318/293 |
| 4,692,674 A | * | 9/1987 | Packard et al. | 318/254 |
| 4,705,997 A | * | 11/1987 | Juzswik | 318/293 |
| 4,744,041 A | * | 5/1988 | Strunk et al. | 324/177 |
| 4,922,172 A | | 5/1990 | Roddy | |
| 5,218,860 A | | 6/1993 | Storar | |
| 5,291,128 A | | 3/1994 | Shekar | |
| 5,568,058 A | | 10/1996 | Davis | |
| 5,875,281 A | * | 2/1999 | Thexton et al. | 318/247 |
| 6,037,692 A | * | 3/2000 | Miekka et al. | 318/198 |
| 6,043,623 A | * | 3/2000 | McCary | 318/632 |
| 6,338,029 B1 | * | 1/2002 | Abbata et al. | 324/545 |

FOREIGN PATENT DOCUMENTS

WO    WO 94/19703    9/1994

* cited by examiner

*Primary Examiner*—Kamand Cuneo
*Assistant Examiner*—Jermele Hollington
(74) *Attorney, Agent, or Firm*—Roger S. Dybvig

(57) ABSTRACT

Methods and apparatus are provided for motor testing wherein performance characteristics are determined for motors exhibiting linear operating characteristic curves without making contact with shafts of the motors during testing. More particularly, a motor to be tested is operated in one direction to a no-load speed and then reversed with current and speed measurements being made during this testing period. A full load or stall point or points and a no-load point or points are determined from the measurements so that linear speed versus torque and/or current versus torque motor characteristic curves can be generated for the motor. Multiple voltages can be applied to determine a family of characteristic curves for the motor.

21 Claims, 4 Drawing Sheets

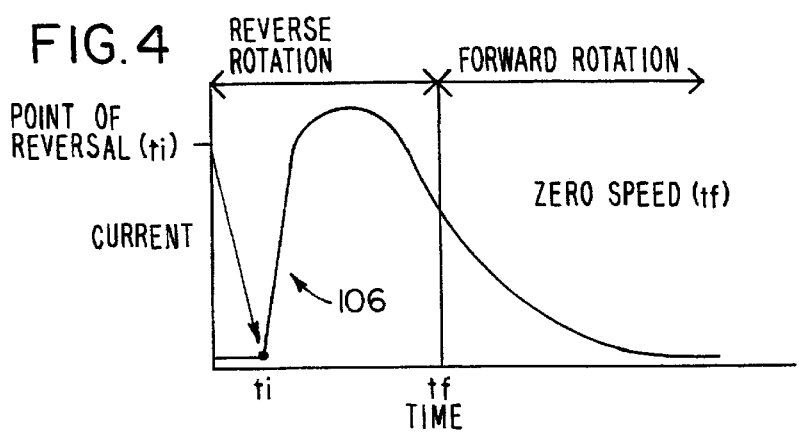
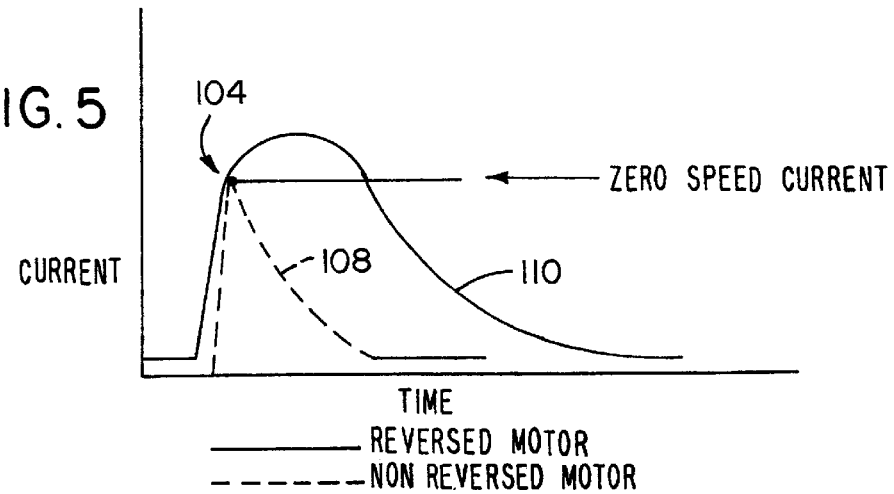
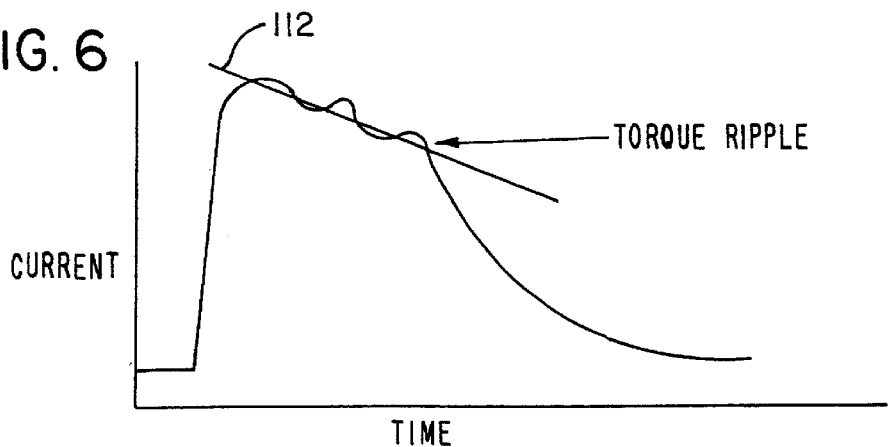

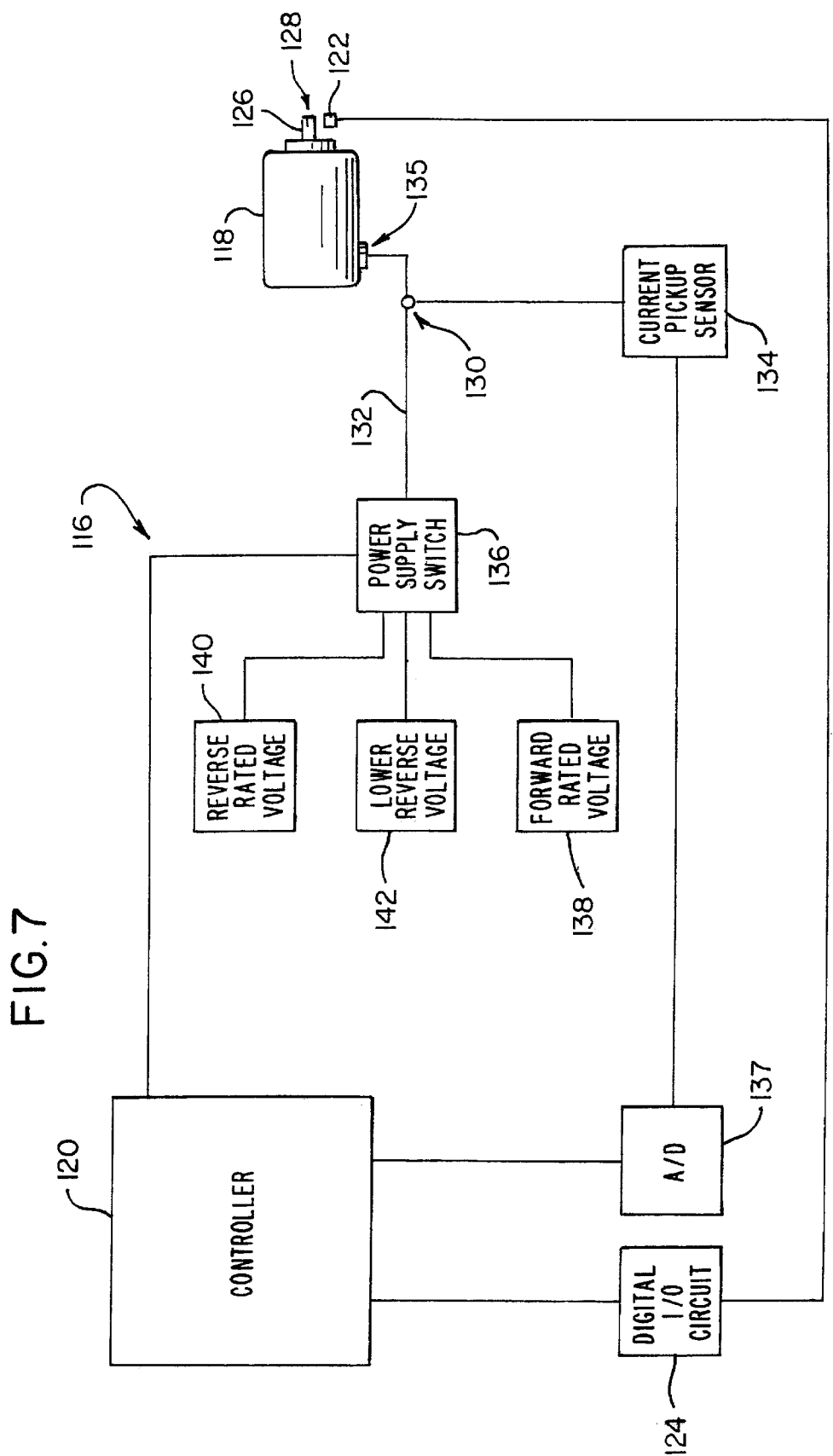

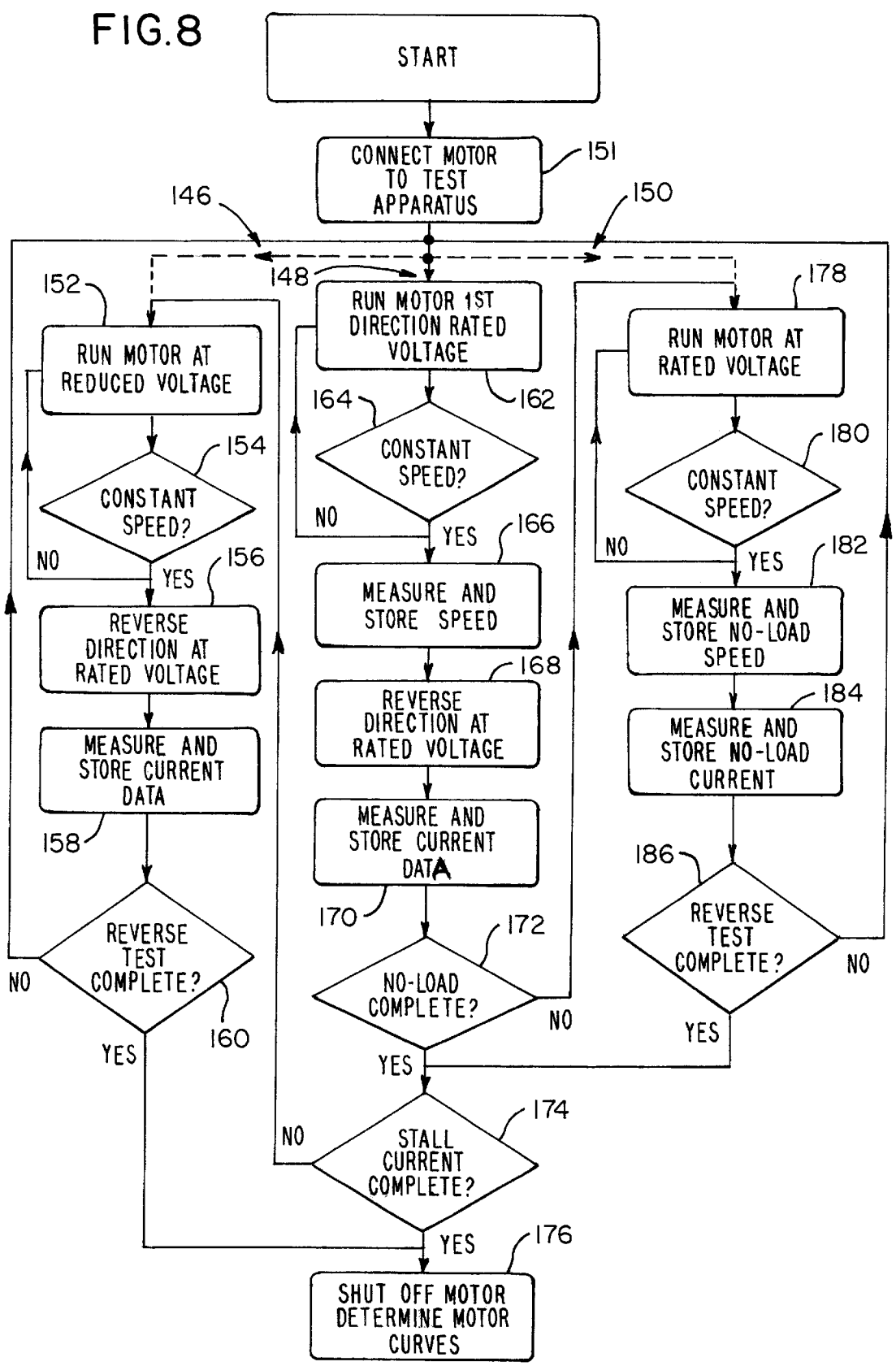

REVERSE INERTIAL LOAD TEST

BACKGROUND OF THE INVENTION

1. Technical Field of the Invention

The present invention relates in general to direct current (dc) motor performance testing and, more particularly, to methods and apparatus for determining performance characteristics of a dc motor without contacting the motor shaft.

2. Description of the Related Art

It has long been a practice in the manufacture of electrical motors to test and publish specific performance characteristics for the motor designs so that the motors can be used most effectively and in appropriate applications. Two relationships that provide useful performance characteristics are motor speed versus torque, and current drawn by the motor versus torque.

In conventional testing arrangements, the shaft of a motor to be tested is coupled to a secondary device during measurements of motor characteristics including speed, current draw and torque. Additional devices, such as torque transducers and brakes, are also often used for the testing. Unfortunately, the use of couplings can lead to problems including shaft binding, misalignment and of course the added time and work required to connect the coupling to the motor shaft and to disconnect the coupling from the motor shaft. Such problems with couplers and the devices connected to a motor shaft for testing can affect the test results and can also cause heat build up within the motor, particularly within the armature, and such heat can be sufficient to skew the results of the test. Such problems can not only affect the test results but also can prevent tests from being repeated consistently. Further, the bulk and awkward operation of such testing devices have made it difficult if not impossible to practically test motors in a production environment.

The present inventors have recognized that testing a motor without the use of a coupling device and other secondary components can result in more reliable motor performance measurements, notably stall current, stall torque, vibration measurements and motor noise measurements. Further, the present inventors have recognized that fixtures required for testing can be greatly simplified, cost can be reduced, and test times can be reduced by a testing arrangement that does not require coupling anything to the shaft of a motor to be tested.

Accordingly, there is a need for improved methods and apparatus for determining motor performance characteristics without contacting the shaft of a motor to be tested by using coupling devices, brakes, torque transducers and the like. Preferably, the improved methods and apparatus would tend to reduce the amount of motor heating thus improving test reliability and repeatability, would be economical and would permit practical motor testing in a production environment.

SUMMARY OF THE INVENTION

This need is met by the invention of the present application wherein methods and apparatus provide for motor testing of performance characteristics for motors exhibiting linear operating characteristic curves without contacting shafts of the motors during testing. More particularly, a motor to be tested is operated in one direction to a no-load speed and then reversed with current and speed measurements being made during this testing period. A full load or stall point or points and a no-load point or points are determined from the measurements so that linear speed versus torque and/or current versus torque motor characteristic curves can be generated for the motor. Multiple voltages can be applied to determine a family of characteristic curves for the motor.

In accordance with one aspect of the present invention, a method for testing motor performance characteristics includes determining a stall current for the motor. This step can occur at any time throughout this method. The stall current is the current peak determined when the shaft is at zero speed and a voltage is applied to the motor. Traditionally, this is accomplished by loading the shaft down to a stall. By the present invention however, the shaft is never loaded. Depending upon the sensitivity of available testing equipment, the stall current can be determined in either one of two ways. If transient signals can be captured quickly enough, the stall current can be determined by measuring a maximum current drawn when the motor is initially started from rest. However, it is sometimes difficult to synchronize testing apparatus and make this measurement. An alternative to determine the stall current includes operating the motor at a percentage of the motor rated voltage. Various testing requirements and types of motors tested will determine the direction in which the motor is operated, however it should be noted that this method works generally for both forward and reverse directions. Additionally, the percentage of voltage applied can be low, for example, 20–25% is often satisfactory. Preferably, the motor should be allowed to reach a constant speed, then the motor direction reversed. When the direction of the motor is reversed, the current drawn by the motor is monitored to determine a startup current peak. The stall current is then set equal to the measured startup current peak.

Another step that can be performed during any part of the method is measuring no-load characteristics for the motor. This involves operating the motor at a constant rate of speed and measuring the speed of the shaft in RPMs and the current drawn while operating at the constant speed. As with the previous step, the motor can be operated in either direction for this step.

The next step includes operating the motor in a first direction, preferably at the rated voltage. Once again, this step can be performed in either direction. Once the shaft is rotating, preferably at a constant speed, the direction of operation is reversed so that the motor operates in a second direction opposite to the first direction. This step includes measuring a time interval for a speed change from a no-load operating speed in the first direction to zero speed after reversing operation of the motor. This time interval can be determined by switching the motor from the first direction to the second direction and then measuring motor current drawn while the motor shaft decelerates. The motor current is compared to the stall current and the time interval is set to the time span starting when the motor is reversed up to the time when the motor current substantially equals the stall current. Usually, more accurate results are obtained by the steps of identifying all occurrences where the motor current equals the stall current and setting the time interval to the time span starting when the motor is reversed up to the last time when the motor current substantially equals the stall current. By collecting current data over this period of time, current ripple can be monitored with excessive current ripple indicating a faulty motor.

After completing the steps above, the stall current or stall torque is calculated for the motor. The stall torque is calculated by multiplying a motor no-load speed by a moment of inertia and dividing the result by the product of a stall torque constant and the time interval previously determined. The stall torque constant and moment of inertia are known values for a given motor.

Finally, based upon the data collected, linear speed versus torque and linear current versus torque characteristic curves can be determined. Further, the method can be repeated any number of times at varying voltages to create a family of linear speed versus torque and linear current versus torque characteristic curves, i.e., each voltage applied results in the determination of one of the curves of the family.

In accordance with another aspect of the present invention, a device for testing a motor without contacting a shaft thereof to determine performance characteristics for the motor according to the above described method includes a controller to initiate the steps and record the measurements. Preferably, three voltage sources are provided including a forward voltage power supply, a lower reverse voltage power supply and a higher reverse voltage power supply. These supplies are switchably connected to the motor being tested by a power supply switching circuit controlled by the controller to supply proper test voltages for testing a motor in accordance with the present invention. A power takeoff wired to the power supply switching circuit provides a removable connection between the motor being tested and the test device. A speed sensor is positioned near the shaft of the motor to provide rotational speed measurements. The speed sensor provides input to the controller either directly, or through a conversion device such as a digital input output circuit which can be external to the controller or included within the controller. Finally, a current measuring device provides input to the controller either directly, or through a conversion device such as an analog-to-digital converter. The current measurement device is preferably placed near to the power takeoff and may comprise a current sensor shunt resistor placed between the power supply switching circuit and the power take off, one or more current pickup sensors connected to the current sensor shunt resistor, and a conversion device between the current pickup sensor or sensors and the controller.

Accordingly, it is an object of the present invention to determine motor performance characteristics without the use of coupling devices, brakes, torque transducers or the like.

It is another object of the present invention to provide a method and apparatus to determine motor performance characteristics that reduces the amount of armature heating thus improving test result repeatability.

It is a further object of the present invention to provide a method and apparatus to determine motor performance characteristics that are economical and provide time savings over coupled systems, and that produce reliable, repeatable results.

Other objects and advantages of the present invention will be apparent in light of the description of the invention embodied herein.

BRIEF DESCRIPTION OF THE DRAWINGS

The following detailed description of the preferred embodiments of the present invention can be best understood when read in conjunction with the following drawings, where like structure is indicated with like reference numerals and in which:

FIG. 4 is an idealized illustration of a current versus time curve showing the current drawn by a motor operating in the reverse direction, and subsequently receiving a directional reversal to change the operation of the motor to its forward operating direction;

FIG. 5 is an idealized illustration of a current versus time curve showing the current drawn by a motor operating in the reverse direction, and subsequently receiving a directional reversal to change the operation of the motor to is forward operating direction as shown with a solid line, and charted for comparison is a motor started in the forward direction from zero speed as shown with a dashed line;

FIG. 6 is an idealized illustration of a current versus time curve showing the current drawn by a motor operating in the reverse direction, and subsequently receiving a directional reversal to change the operation of the motor to its forward operating direction where torque ripple is evidenced in the current;

FIG. 7 is a block diagram of apparatus operable in accordance with the present invention for determining motor performance characteristics without contact to a shaft of the motor; and FIG. 8 is a flow chart for a typical controller showing the steps for determining motor performance characteristics without contact to a shaft of the motor in accordance with the present invention.

DETAILED DESCRIPTION OF THE INVENTION

It should be noted that the present invention as described herein is generally applicable to motors that exhibit a substantially linear speed versus torque and/or current versus torque curve. However, it is discussed herein with reference to a dc permanent magnet motor for which it is particularly applicable and initially being used.

Figure 1:
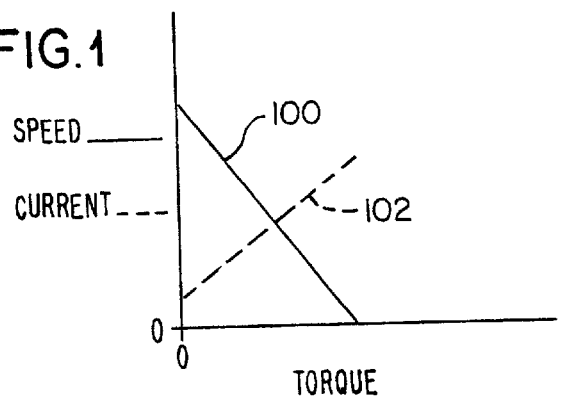
FIG. 1 is an illustration of a typical speed versus torque curve plotted in a solid line, and a current versus torque curve plotted in a dashed line.

Reference will now be made to FIG. 1 which illustrates linear speed versus torque motor characteristic curve 100 and linear current versus torque motor characteristic curve 102. As is well known, for any linear curve, if two points along the curve are known, the entire linear range can be predicted based upon simple mathematical principles. One motor that exhibits such characteristic curves is a dc permanent magnet motor.

The permanent magnet motor converts electrical energy into mechanical energy through the use of two magnetic fields. The first magnetic field is produced by permanent magnets, and the second magnetic field is generated by electrical current supplied to windings of the motor. Because of the characteristics of the magnets selected for the motor, no electrical power is required to form the static magnetic field for the motor. The magnetic flux thus remains essentially constant over an extended range of armature currents so that the speed versus torque and current versus torque curves are linear over this range. The permanent magnet motor exhibits functionally useful characteristics including that it is operable in both a forward direction and a reverse direction. Further, the permanent magnet motor can be directionally reversed while the shaft is at rest or during rotation, and is operable using a dc power supply. The performance of the permanent magnet motor can be defined by two relationships, the variation of speed with respect to torque, and the variation of current drawn by the motor with respect to torque.

The present invention provides for the quick and accurate determination of these relationships. It is understood that if two points are known along a linear region, all points within that linear region can be determined. This is the classic formula, y=mx+b, where x and y are vector coordinates, m is the slope of the linear curve and b is the zero intercept of the curve. In practice, no-load and stall or full load conditions represent determinable extremes sufficient to define speed versus torque and current versus torque relationships. The full load conditions are determined without the need to actually load the motor shaft by determining the motor stall current, then computing the stall torque using a well known formula. The no-load conditions are determined using measurements taken on the motor during testing.

It is noted that the motor testing arrangement of the present invention is extremely flexible and can be practiced in a large number of ways. For example, several of the steps of the methods can be performed independent of order. Additionally, the motor testing arrangement provides for both real time analysis, or alternatively, all steps can be completed with data being recorded during testing for later processing and computation.

The Reverse Inertial Load Test

The first step that can be performed independent of order is to determine the stall current. As suggested by FIG. 5, one way to determine the zero speed or stall current is to apply a voltage to a motor initially at rest and measure the peak current 104 drawn by the motor. While this is an acceptable approach in theory, in practice this measurement can be difficult. Due to measuring device technology and the speed at which accurate measurements can be taken, alternative approaches to determining the stall current may be desirable. One alternative which may be used in the present invention is to operate the motor in a first direction at a voltage that is a percentage of the first direction rated voltage. Any reasonable value is acceptable, however values up to approximately 25% of the rated voltage are currently preferred. It is best to allow the motor shaft to achieve a steady state speed before continuing.

Once the shaft speed is substantially constant, operation of the motor is reversed so that the shaft decelerates for operation in a second direction opposite to the first direction. Preferably, the motor is reversed by applying the second direction rated voltage to the motor. Starting from the time the motor's operating direction is reversed, the startup current drawn by the motor is measured. The peak startup current measured is considered the stall current for the motor being tested. Preferably, the motor shaft is then allowed to come to a complete stop before continuing.

By operating the motor in a first direction and then subsequently changing the direction of operation, measurement equipment can accurately measure the changes in current. No precise speed of operation is required, and the speed actually selected will depend upon motor characteristics. However, should the voltage selected be set too high, the current measurements may become skewed. One possible source of this problem is that the motor must overcome back EMF under these conditions. As such, running the motor at too high a speed can inflate stall current measurements. Also, the first direction of motor operation can be chosen as either the forward direction or the reverse direction and will depend upon factors relating to motor design and user requirements. For example, considerations including the brush orientation and whether the motor is intended to be operated bi-directionally affect the approach used.

A second step that can be performed independently of the other steps includes determining the no-load conditions. The no-load conditions can be easily determined by applying a voltage to the motor and measuring the speed of rotation of the shaft in revolutions per minute (RPMs) and measuring the current drawn by the motor at no-load. Preferably, the shaft should be allowed to reach a constant speed of rotation before taking the measurements. Again it is preferred to allow the motor shaft to come to a complete stop before continuing. Further, as is characteristic of the present invention since no contact is made to the motor shaft, measurements are taken with no-load applied to the shaft. Under these conditions, the torque is considered essentially zero. Based upon the presumption that the torque is essentially zero under these conditions, it can be seen from this step that a data point for the desired performance curves derives directly from the measured speed and current. Further, if the speed versus torque curve is the only motor characteristic of concern, then the current need not be measured in this step. Likewise, if current versus torque is the only motor characteristic of concern, then the motor speed need not be measured in this step.

It is noted that a particular direction of motor rotation is not essential to this step. Considerations such as the nature of the motor and user requirements will determine the direction selected. For example, some motors are designed for bi-directional operation, such as an automotive motor controlling operation of a window, while other motors are designed for unidirectional operation, such as an automotive heater fan motor or a windshield wiper motor. Under these conditions, a user may require forward direction no-load characteristics, reverse direction no-load characteristics or both forward direction and reverse direction no-load characteristics. The present invention accommodates all such circumstances. Finally, it is typical that the rated voltage is used to determine the performance characteristics, and it is preferable to use the rated voltage to determine no-load characteristics. However, if a family of curves are being determined, or alternatively a specified operating voltage is required which is distinct from the rated voltage, it is acceptable to use any such voltage or voltages.

To determine full load conditions, the stall torque must be determined. In the prior art, the motor shaft is coupled to a device which loads the motor to a stall condition to measure full load or stall conditions. Unfortunately, loading the motor shaft results in heating the armature which heat can induce errors in the measurements and can reduce the ability to obtain repeatable, consistent results. However, in accordance with the present invention the motor shaft is not coupled to any device and is not loaded down but instead stall torque is calculated. A recognized formula for determining stall torque is:

$$StallTorque = \frac{\Delta S J}{C \Delta t}$$

where ($\Delta S$) is a change in speed, (J) is a motor inertia constant, (C) is a stall torque constant and ($\Delta t$) is a change in time. For this equation, the motor inertia constant (J) and stall torque constant (C) are known and provided from motor manufacturer specifications. Determining a speed change (ΔS) and a change in time or time interval (Δt) are accomplished by operating the test motor in a first direction to determine a no-load operating speed. Preferably, this step is performed at the first direction rated voltage, but can be performed at any lesser voltage. Also, the first direction can be either forward or reverse based upon application and user requirements as already discussed. It is further preferred to allow the motor shaft to reach a substantially constant rate of speed before continuing. Next, substantially instantaneously, operation of the motor is reversed and a time interval for a speed change from the no-load operating speed to zero speed is measured after reversing operation of the motor. Thus, the speed change (ΔS) is the no-load operating speed and the time interval (Δt) is the time it takes the motor to switch directions of operation.

Depending upon the sensitivity of particular testing apparatus, for example a shaft sensor which counts each revolution of the shaft, it may be difficult to determine the point at which the motor shaft is slowed to zero speed before being accelerated in the opposite direction. To overcome this problem, it is noted in the current invention that the motor shaft is at zero speed approximately when the measured current equals the stall current. If the determination of the stall current has previously been completed, then the time interval can be determined. One approach is to record the current measurements at known periodic intervals and process the recorded data at a later time to determine the time to zero. This approach is required if the determination of the stall current has not been completed. The theory behind this process can best be illustrated by reference to FIG. 2 through FIG. 5.

Figure 2:
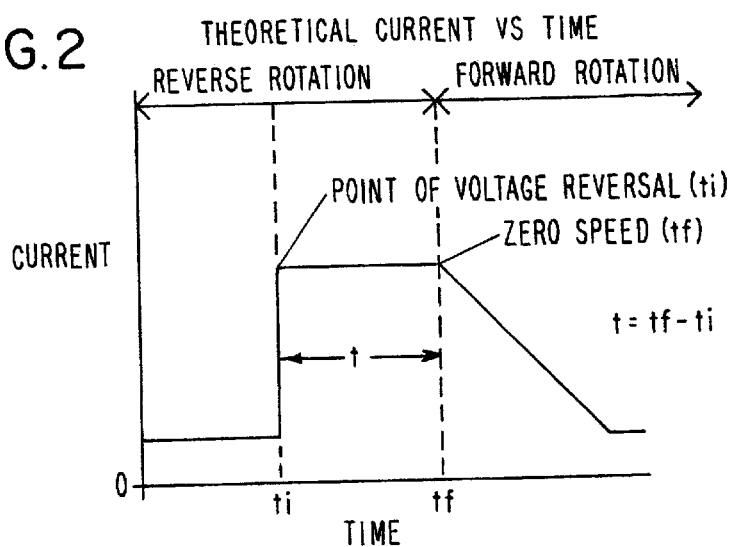
FIG. 2 is an idealized illustration of a current versus time curve demonstrating the theoretical current drawn by a motor operating in a reverse direction, and subsequently receiving a directional reversal to change the operation of the motor to its forward operating direction.
Figure 3:
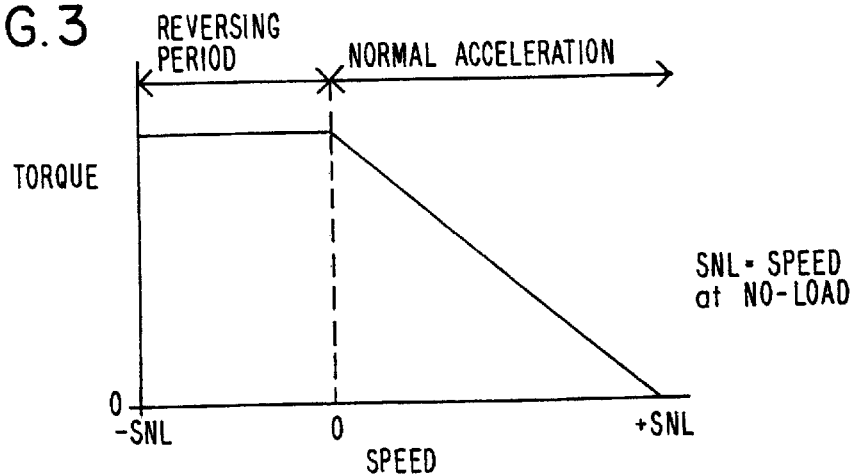
FIG. 3 is an idealized illustration of a torque versus speed curve demonstrating the theoretical torque behavior of a motor operating in the reverse direction, and subsequently receiving a directional reversal to change the operation of the motor to its forward operating direction.

With reference to FIG. 2, a reverse or negative voltage has been applied to a motor being tested and a constant speed in the reverse direction has been obtained. As shown in FIG. 2, the current drawn by the motor is theoretically constant. At the instant the motor direction is reversed, as indicated by time (ti), the current spikes. The current drawn by the motor stays substantially constant for a period of time while the shaft decelerates from rotation in the reverse direction toward rotation in the forward direction. During this period of time, there is a forward or positive voltage applied to the motor, but the shaft is still rotating in the reverse direction. As soon as the shaft has decelerated to zero speed, as indicated by time (tf), it begins to accelerate in the opposite, or forward direction until it again reaches a steady state speed. During this period of time, the current drawn linearly decreases until the rotation of the shaft reaches a steady state speed, where the current drawn by the motor again becomes constant. While this discussion is with reference to operating the motor in the reverse direction, then switching the motor into forward direction, the principles apply equally as well to operating the motor in the forward direction, then reversing the motor to operate in the reverse direction.

With reference to FIG. 3, again the motor is being operated in the reverse direction. Theoretically, when the reversing, in this case forward, voltage is applied to the motor, the torque remains substantially constant until the shaft decelerates to zero speed. Once the shaft begins to accelerate in the forward direction, the torque begins to decrease linearly. With no-load attached to the shaft, the torque theoretically decreases to zero when the shaft has reached a steady state speed.

With reference to FIG. 4, in actual operation, linear curves are usually not realized. As a practical matter, FIG. 4 shows the current measured when a motor is operated in one direction, then subsequently reversed to operate in the opposite direction. Contrasting FIG. 4 to FIG. 2, shows that in practice, the current drawn does not instantaneously spike, but rather ramps up as shown at 106. Further, the current does not exhibit the truly linear characteristics of FIG. 2. Most notably, the current measured actually exceeds the stall torque current which occurs at the instant when the shaft has decelerated to zero speed and begins it's acceleration towards a steady state speed in the opposite direction.

Referring now to FIG. 5, the current drawn by a motor started from rest (dashed line curve 108) is contrasted to the current drawn by the same motor operating in one direction, then subsequently reversed to operate in the opposite direction (solid line curve 110). The peak current 104 of the dashed line curve 108 substantially corresponds to the stall current and, as shown, occurs around zero speed of the shaft. Accordingly, the motor shaft zero speed can be determined by measuring the motor current while the motor shaft is reversing and comparing the motor current measured to the previously obtained stall current. The time interval is set to the time span starting when the motor direction is reversed and ending when the motor current substantially equals the stall current, i.e., t=tf−ti, see FIGS. 2 and 4. As can be seen from FIG. 5, the current identified by the solid line curve 110 actually equals the stall current at two points in time.

It is also possible that the current measured will ripple, a so-called torque ripple, above and below the stall current level as shown in FIG. 6. Under these circumstances, if the test is to be continued, it is preferable to set the time interval to the time span starting when the motor operation is reversed and ending when the average motor current substantially equals the stall current. By determining the variations of measured current around a line 112 extending through the current measurement data captured from the time of motor reversal to zero speed, which can be performed using commercially available software for example EXCEL 2000 available from Microsoft, the amount of motor current ripple can be determined. For current ripple exceeding a defined level, for example 20% of average motor current, the motor is presumed to be faulty and further testing of the motor is normally aborted.

Preferably, the instantaneous reversal of motor direction is accomplished using a second voltage substantially equal in amplitude to the motor's operating voltage and opposite in polarity to the first voltage. An acceptable approach under these circumstances is to provide two power supplies having opposite polarities and switching between the two power supplies.

Once the full load point or stall torque has been determined and the no-load speed is known, a linear graph of speed versus torque can be derived using the equation:

$$RPM = -\left[\frac{RPM_{NL}}{T_{ST}}\right] \times T + RPM_{NL}$$

where RPM is the resultant speed at the applied load, $RPM_{NL}$ is the measured no-load speed, T is the applied load and $T_{ST}$ is the stall torque.

If the no-load current is known, a linear graph of current versus torque can be derived using the equation:

$$I = \left[\frac{I_{ST} - I_{NL}}{T_{ST}}\right] \times T - I_{NL}$$

where I is the resultant current at the applied load, T is the applied load, $I_{ST}$ is the measured stall current, $T_{ST}$ is the stall torque and $I_{NL}$ is the measured current at no-load.

The Reverse Inertial Load Apparatus

Reference will now be made to FIG. 7 which illustrates apparatus 116 in accordance with the present invention for testing the performance characteristics of a motor 118 and comprises a controller 120. The controller 120 may comprise a programmable logic controller (PLC) or any one of a large variety of commercially available microprocessors including a general purpose computer or PC and is programmed in accordance with the flow chart of FIG. 8. The controller 120 requires a minimum of two inputs. The first required input is a signal indicating motor or shaft speed which is generated in the illustrated embodiment using a speed sensor 122 connected to a conventional digital input/output (I/O) circuit 124. The digital I/O circuit 124 can be housed within the controller 120, or may be included as a separate component as illustrated. The speed sensor 122 is placed adjacent the motor shaft 126 such that an accurate reading of the motor shaft speed can be determined, and is usually in close proximity to the motor shaft 126. For example, an optical detector can be used to detect rotation of the shaft 126 by monitoring a mark 128 on the shaft. Alternately, the wobble of an eccentric shaft (not shown) as used, for example, in some automotive windshield wiper motors can be monitored using a proximity detector. In a working embodiment of the present invention, the wobble of an eccentric shaft was monitored using a B13-Q06-AP6X2 proximity detector which is commercially available from Turk.

A current measuring device is used to measure the current drawn by the motor 118. As illustrated, the current measuring device includes a current pickup sensor 130, such as a shunt resistor, placed in a power supply lead 132 for the motor 118 under test and a current pickup sensor 134. The power supply lead 132 provides the power connection to a power takeoff 135 that is removably coupled to the motor 118 under test. The current pickup sensor 134 is connected to an analog-to-digital (A/D) converter 137 which generates a digital current signal as a second input to the controller 120.

The controller 120 controls a power supply switching circuit 136 which can precisely and quickly switch the proper voltage to the power takeoff 135 and hence to the connected motor 118 being tested. The power supply switching circuit 136 can be constructed using conventional power switching devices such as SCRs, power transistors or the like. Three power supplies provide input voltages to the power supply switching circuit 136. A main forward voltage power supply, or forward direction rated voltage supply 138, an upper back voltage power supply or reverse direction rated power supply 140 and a lower reverse direction power supply 142 feed power to the power supply switching circuit 136. The lower reverse direction power supply 142 provides a voltage that is less than the reverse direction rated power supply 140, for example 25% of the reverse direction rated power supply 140, and is used to obtain stall current measurements.

In operation, the motor 118 is positioned in the apparatus 116 and is coupled to the power takeoff 135. As has been pointed out above, the stall current measurement and no-load current and speed measurement can be performed at any time during the test. This is indicated in the flow diagram of FIG. 8 by flow path arrows 146, 148 and 150 which correspond to stall current testing, motor reverse testing and no-load testing, respectively, after the motor has been connected to the test apparatus, see block 151. The controller 120 can be programmed to process stall current first, in which case the controller 120 follows program flow indicated by the flow path arrow 146. The controller 120 also can be programmed to determine no-load speed and current characteristics first, in which case the controller 120 follows program flow indicated by the flow path arrow 150. Finally, the controller 120 can be programmed to perform the reverse test first by following program flow indicated by the flow path arrow 148. The dashed lines of FIG. 8 demonstrate that program flow can occur in any order.

For example, where the stall current is to be determined first, the test is started and the controller 120 is programmed to follow the flow path arrow 146. The controller 120 signals the power supply switching circuit 136 to operate the motor 118 in a reverse direction at a percentage of a reverse direction rated voltage, see block 152, by connecting the lower reverse direction power supply 142 to the motor 118 via the power supply switching circuit 136 and power takeoff 135. Power to the motor is maintained until the motor 118 reaches a substantially constant lower back drive operating speed, see block 154. The speed of the motor shaft 126 is determined by the speed sensor 122 positioned adjacent the motor shaft 126. Data from the speed sensor 122 is converted to a digital format by the digital I/O circuit 124.

Once the controller 120 determines that the speed of motor drive shaft 126 is substantially constant, the controller 120 is programmed to apply a forward voltage to the motor 118 to reverse the operation of the motor 118 to a forward direction of operation, see block 156. This is accomplished by signaling the power supply switching circuit 136 to disconnect the lower reverse direction power supply 142 from the motor 118 and substantially simultaneously connect the forward direction rated voltage supply 138 to the motor 118. The controller 120 is then programmed to record current drawn by the motor 118 utilizing signals generated by the current measuring device as described above, see block 158.

The controller 120 is programmed to analyze the current measurements recorded and identify the peak current measurement as the stall current. The power is disconnected from the motor 118 allowing the motor shaft 126 to coast to a stop. Again, the speed sensor 122 provides signals representative of the speed of the motor shaft 126. The controller 120 then checks to see whether the reverse test has been performed, see block 160. Since it has not in this instance, the controller then is programmed to follow either the reverse test path along the flow path arrow 148 or the no-load test path along the flow path arrow 150.

The controller 120 can also be programmed to initially follow the reverse test path along the flow arrow 148 to operate the motor 118 in the reverse direction at the reverse rated voltage by signaling to the power supply switching circuit 136 to switch the reverse direction rated power supply 140 to supply power to the motor 118 through the power takeoff 135, see block 162. It is noted that the initial direction of operation can be in the forward direction with reversal being to the reverse direction if required for a given motor test. Again, the controller 120 is programmed to allow the motor drive shaft 126 to reach a substantially constant no-load speed, see block 164. The controller 120 is further programmed to measure and record the constant no-load speed, see block 166. Once a substantially constant speed has been determined, the controller 120 signals the power supply switching circuit 136 to substantially instantaneously switch the power to the forward direction rated voltage supply 138, see block 168.

The controller 120 is programmed to record the current readings supplied by via the current measuring device as described above, see block 170. If the reverse test is run initially, the no-load and stall current tests are run subsequently, see the blocks 172, 174. While the no-load test is performed first as shown in FIG. 8, it is noted that the stall current test could just as well be run before the no-load test.

Upon obtaining all necessary measurements, the controller 120 is programmed to shut off the motor 118 by sending a signal to the power supply switching circuit 136 which disconnects all power from the motor 118, see block 176. The controller 120 then computes a motor reversal time interval extending from the time when the controller 120 switched the reverse direction rated voltage supply 140 to the forward direction rated voltage supply 138, up to the point at which the motor shaft 126 slows to zero speed. Further, the controller 120 calculates stall torque for the motor based on the time interval and the no-load speed as described above. Instead of using signals from the speed sensor 122, a time interval is computed using the determined stall current measurements. This is accomplished by comparing the values of the current data collected to the previously recorded value for stall current. Based upon the known sampling frequency and the number of samples recorded up to the identified stall current position, the time to zero speed is determined. Next, stall torque is computed as described above by multiplying the recorded no-load speed by the moment of inertia, a preprogrammed variable. This quantity is then divided by the product of a preprogrammed stall torque constant having a value of 308 times the computed time to zero speed.

The controller 120 can also be programmed to initially follow the no-load speed and current by following the flow path arrow 150 to operate the motor 118 in one direction at the rated voltage for that direction by signaling to the power supply switching circuit 136 to switch the appropriate rated power supply to supply power to the motor 118 through the power takeoff 135, see block 178. The controller 120 is programmed to allow the motor drive shaft 126 to reach a substantially constant no-load speed, see block 180. The controller 120 is then programmed to measure and record the no-load speed and the no-load current, see blocks 182 and 184. Next, it is determined whether the reverse test has been performed, see block 186. If it has, testing progresses to block 174, otherwise, the controller 120 can be programmed to proceed to the reverse test. Alternately, the controller 120 could be programmed to proceed to the stall current test as should be apparent.

Having described the invention in detail and by reference to preferred embodiments thereof, it will be apparent that modifications and variations are possible without departing from the scope of the invention defined in the appended claims.

What is claimed is:

1. A method of testing a dc motor without contacting a shaft thereof to determine performance characteristics for said motor, said method comprising the steps of:
   determining a stall current for said motor;
   measuring no-load characteristics for said motor;
   operating said motor in a first direction;
   reversing operation of said motor so that said motor operates in a second direction;
   measuring a time interval for a speed change from a no-load operating speed in said first direction to zero speed after reversing operation of said motor; and
   calculating stall torque for said motor based on said speed change and said time interval.

2. The method of testing a dc motor without contacting a shaft thereof to determine performance characteristics for said motor as claimed in claim 1 wherein said step of determining a stall current for said motor comprises the step of measuring a maximum current drawn when said motor is initially started from rest.

3. The method of testing a dc motor without contacting a shaft thereof to determine performance characteristics for said motor as claimed in claim 1 wherein said step of reversing operation of said motor so that said motor operates in a second direction comprises the steps of:
   providing two power supplies; and
   switching between said two power supplies.

4. The method of testing a dc motor without contacting a shaft thereof to determine performance characteristics for said motor as claimed in claim 1 further comprising the step of monitoring motor current ripple to identify motor faults.

5. The method of testing a dc motor without contacting a shaft thereof to determine performance characteristics for said motor as claimed in claim 1 wherein said step of calculating stall torque comprises the step of multiplying a motor no-load speed by a moment of inertia of said motor and dividing the result by the product of a stall torque constant and said time interval.

6. The method of testing a dc motor without contacting a shaft thereof to determine performance characteristics for said motor as claimed in claim 1 further comprising the step of selecting said motor to be a permanent magnet motor.

7. The method of testing a dc motor without contacting a shaft thereof to determine performance characteristics for said motor as claimed in claim 1 further comprising the step of selecting said motor to be a brushless dc motor.

8. The method of testing a dc motor without contacting a shaft thereof to determine performance characteristics for said motor as claimed in claim 1 wherein said step of determining a stall current for said motor comprises the steps of:
   operating said motor at a percentage of a first direction rated voltage;
   reversing operation of said motor;
   measuring a startup current; and
   determining a startup current peak, said stall current being set equal to said startup current peak.

9. The method of testing a dc motor without contacting a shaft thereof to determine performance characteristics for said motor as claimed in claim 8 wherein said step of reversing operation of said motor comprises the steps of:
   operating said motor at a substantially constant rate of speed in said first direction; and
   subsequently applying a second direction rated voltage to said motor.

10. The method of testing a dc motor without contacting a shaft thereof to determine performance characteristics for said motor as claimed in claim 1 wherein said step of measuring no-load characteristics comprises the steps of measuring a motor speed and a motor current.

11. The method of testing a dc motor without contacting a shaft thereof to determine performance characteristics for said motor as claimed in claim 10 wherein said step of measuring no-load characteristics further comprises the steps of:
   operating said motor in said first direction;
   operating said motor at a substantially constant speed;
   measuring said motor speed at said substantially constant speed; and
   measuring said motor current at said substantially constant speed.

12. The method of testing a dc motor without contacting a shaft thereof to determine performance characteristics for said motor as claimed in claim 1 wherein said step of reversing operation of said motor so that said motor operates in a second direction comprises the steps of:

maintaining a first voltage to said motor; and substantially instantaneously switching said first voltage to a second voltage.

13. The method of testing a dc motor without contacting a shaft thereof to determine performance characteristics for said motor as claimed in claim 12 wherein said second voltage is substantially equal in amplitude and opposite in polarity to said first voltage.

14. The method of testing a dc motor without contacting a shaft thereof to determine performance characteristics for said motor as claimed in claim 1 wherein said step of measuring a time interval for a speed change from a no-load operating speed in said first direction to zero speed after reversing operation of said motor further comprises the steps of:

switching said motor from said first direction to said second direction;

measuring motor current;

comparing said motor current to said stall current; and setting said time interval to the time span starting when said motor is switched up to an occurrence when said motor current substantially equals said stall current.

15. The method of testing a dc motor without contacting a shaft thereof to determine performance characteristics for said motor as claimed in claim 14 wherein said step of measuring a time interval further comprises the steps of:

identifying all occurrences where said motor current equals said stall current; and setting said time interval to the time span starting when said motor is switched up to the last occurrence when said motor current substantially equals said stall current.

16. The method of testing a dc motor without contacting a shaft thereof to determine performance characteristics for said motor as claimed in claim 1 wherein said motor characteristics comprise a linear speed versus torque motor performance curve determined by performing the step of connecting a point determined by said no-load characteristics for said motor to a point determined by said stall torque on a chart wherein said speed comprises one axis and said torque comprises a second axis.

17. The method of testing a dc motor without contacting a shaft thereof to determine performance characteristics for said motor as claimed in claim 16 further comprising the step of determining a family of linear speed versus torque curves by performing the steps of claim 16 with a corresponding family of voltages applied to said motor.

18. The method of testing a dc motor without contacting a shaft thereof to determine performance characteristics for said motor as claimed in claim 1 wherein said motor characteristics comprise a linear current versus torque motor performance curve determined by performing the step of connecting a point determined by said no-load characteristics for said motor to a point determined by said stall torque on a chart wherein said current comprises one axis and said torque comprises a second axis.

19. The method of testing a dc motor without contacting a shaft thereof to determine performance characteristics for said motor as claimed in claim 18 further comprising the step of determining a family of linear current versus torque curves by performing the steps of claim 18 with a corresponding family of voltages applied to said motor.

20. A method of testing a motor without contacting a shaft thereof to determine performance characteristics for said motor, said method comprising the steps of:

operating said motor in a reverse direction at a percentage of a reverse direction rated voltage until said motor reaches a substantially constant lower back drive speed;

applying a forward direction rated voltage to said motor to operate said motor in a forward direction;

measuring current flow to said motor to determine a stall current for said motor;

allowing said motor to coast to a stop;

operating said motor in said reverse direction at said reverse direction rated voltage until said motor reaches a substantially constant no-load speed;

measuring said no-load speed;

switching substantially instantaneously, said reverse direction rated voltage to a forward direction rated voltage to operate said motor in a forward direction;

determining a motor reversal time interval extending from switching said reverse direction rated voltage to said forward direction rated voltage, up to said motor slowing to zero speed; and calculating stall torque for said motor based on said time interval and said no-load speed.

21. An apparatus for testing a motor without contacting a shaft thereof to determine performance characteristics for said motor, comprising:

a controller;

a power take-off for coupling power to a motor to be tested;

a power supply switching circuit connected to said power take-off and controlled by said controller;

a forward direction rated voltage power supply connected to said power supply switching circuit;

a lower reverse voltage power supply connected to said power supply switching circuit;

a reverse direction rated voltage power supply connected to said power supply switching circuit;

a current measuring device connected between said controller and said power take-off; and a speed sensor positionable near the shaft of said motor and connected to said controller for non-contact sensing of the speed of said shaft, said controller controlling said power supply switching circuit in response to speed and current measurements on said motor to be tested to sequentially connect said power supplies to said motor.

\* \* \* \* \*